United States Patent
Feng et al.

(10) Patent No.: US 7,432,192 B2
(45) Date of Patent: Oct. 7, 2008

(54) POST ECP MULTI-STEP ANNEAL/$H_2$ TREATMENT TO REDUCE FILM IMPURITY

(75) Inventors: Hsien-Ping Feng, Yonghe (TW); Jung-Chih Tsao, Taipei (TW); Hsi-Kuei Cheng, Hsinchu (TW); Chih-Tsung Lee, Hsinchu (TW); Ming-Yuan Cheng, Taipei (TW); Steven Lin, Shih-Chu (TW); Ray Chuang, Hsin Chu (TW); Chi-Wen Liu, Hsinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 347 days.

(21) Appl. No.: 11/347,946

(22) Filed: Feb. 6, 2006

(65) Prior Publication Data

US 2006/0216930 A1    Sep. 28, 2006

Related U.S. Application Data

(62) Division of application No. 10/812,729, filed on Mar. 30, 2004, now Pat. No. 7,030,016.

(51) Int. Cl.
    *H01L 21/4763*    (2006.01)
(52) U.S. Cl. .................. 438/627; 438/624; 438/622; 438/638; 438/673; 257/774; 257/751; 257/E21.584; 257/E21.585

(58) Field of Classification Search ................. 257/774, 257/751, 210–211; 438/637–638, 672–673, 438/618–624, 700
See application file for complete search history.

(56) References Cited

U.S. PATENT DOCUMENTS

| | | | |
|---|---|---|---|
| 6,077,780 A | 6/2000 | Dubin | 438/687 |
| 6,221,765 B1 | 4/2001 | Ueno | 438/653 |
| 6,245,670 B1 | 6/2001 | Cheung et al. | 438/637 |
| 6,350,688 B1 | 2/2002 | Liu et al. | 438/687 |
| 6,380,084 B1 | 4/2002 | Lim et al. | 438/687 |
| 6,391,777 B1 | 5/2002 | Chen et al. | 438/687 |
| 6,582,569 B1 | 6/2003 | Chiang et al. | 204/192 |
| 2003/0140988 A1 | 7/2003 | Gandikota et al. | 148/527 |
| 2005/0095847 A1 | 5/2005 | Kunishima et al. | 438/637 |

*Primary Examiner*—Dung A. Le
(74) *Attorney, Agent, or Firm*—Duane Morris LLP (57) ABSTRACT

A method of forming a copper interconnect in a dual damascene scheme is described. After a diffusion barrier layer and seed layer are sequentially formed on the sidewalls and bottoms of a trench and via in a dielectric layer, a first copper layer is deposited by a first ECP process at a 10 mA/cm$^2$ current density to fill the via and part of the trench. A first anneal step is performed to remove carbon impurities and optionally includes a $H_2$ plasma treatment. A second ECP process with a first deposition step at a 40 mA/cm$^2$ current density and second deposition step at a 60 mA/cm$^2$ current density is used to deposit a second copper layer that overfills the trench. After a second anneal step, a CMP process planarizes the copper layers. Fewer copper defects, reduced S, Cl, and C impurities, and improved Rc performance are achieved by this method.

20 Claims, 4 Drawing Sheets

POST ECP MULTI-STEP ANNEAL/H₂ TREATMENT TO REDUCE FILM IMPURITY

RELATED PATENT APPLICATION

This application is a divisional application of U.S. patent application Ser. No. 10/812,729, filed Mar. 30, 2004, now U.S. Pat. No. 7,030,016, titled "Post ECP Multi-step Anneal/ H2 Treatment to Reduce Film Impurity," the entire contents of which application is incorporated herein by reference. This application is related to U.S. patent application Ser. No. 10/987,713, filed on Nov. 12, 2004, now U.S. Pat. No. 7,189, 650, which is assigned to a common assignee.

FIELD OF THE INVENTION

The invention relates to a metal interconnect with a low impurity content and a method for making the same that involves a damascene method in which an opening is filled in two metal deposition steps with an anneal after each step.

BACKGROUND OF THE INVENTION

Integrated circuits in a semiconductor device are comprised of metal wiring that is insulated by a dielectric layer to prevent capacitance coupling or crosstalk between the electrical pathways. Metal wiring that forms interlevel and intra-level connections which are commonly referred to as interconnects is frequently formed by depositing a metal in an opening such as a via hole or a trench in a single damascene approach or in a trench and via simultaneously in a dual damascene scheme. Usually, a diffusion barrier layer is formed on the sidewalls of the dielectric layer in the via and/or trench before metal deposition to protect the metal from corrosion and oxidation and to prevent metal ions from migrating into the dielectric layer. The metal layer is typically planarized by a chemical mechanical polish (CMP) process that removes excess metal above the dielectric layer so that the metal layer becomes coplanar with the dielectric layer.

Recent progress in forming metal interconnects includes lowering the resistivity (R) of the metal by replacing aluminum with copper, decreasing the width of the vias and trenches with improved lithographic materials and processes, and reducing the dielectric constant (k) of the dielectric layer to minimize capacitance coupling (c) between the metal interconnects. Thus, by minimizing R and c simultaneously, the speed of an integrated circuit becomes faster because of a lower Rc delay.

As the widths of vias and trenches shrink, the semiconductor industry is faced with the increasingly difficult challenge of forming a copper interconnect without voids. Voids can easily form along grain boundaries during metal deposition and cause reliability issues. In addition, a premium is placed on metal purity in the interconnect in order to ensure high performance and reliability. For instance, copper is typically deposited by an electroless or electroplating technique that involves an electrolyte solution containing sulfate and chloride ions. Small amounts of these ions are frequently trapped inside the deposited copper layer and the resulting sulfate and chloride impurity can lead to corrosion and reduced performance. Furthermore, organic additives containing carbon are frequently used in the electrolyte solution and carbon may become trapped within the deposited metal layer. Therefore, a copper deposition method is needed that minimizes impurities within an interconnect.

Figure 1:
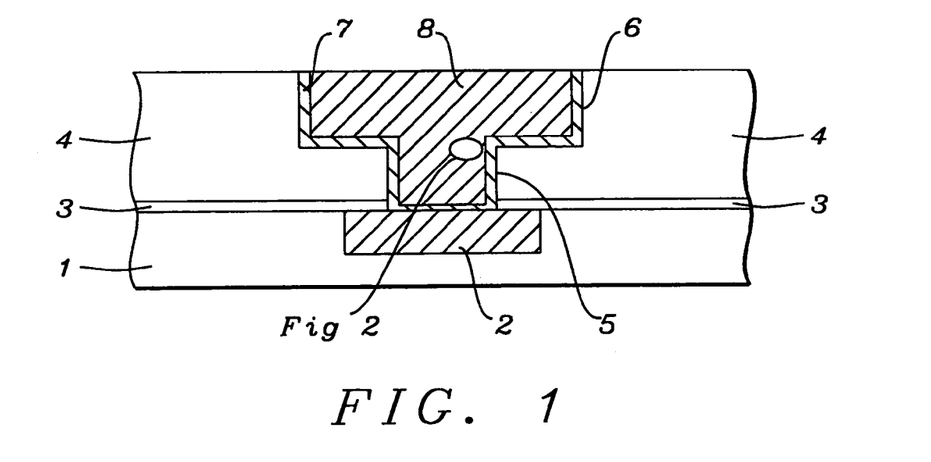
FIG. 1 is a cross-sectional view showing a copper damascene structure formed by a prior art method.

Referring to FIG. 1, a conventional copper damascene structure is illustrated. A substrate 1 is shown having a conductive layer 2 that has an exposed top surface. An etch stop layer 3 and a dielectric layer 4 are successively formed on substrate 1. A via opening 5 is formed by a well known photoresist patterning (not shown) and plasma etch sequence and is aligned above the conductive layer 2. Next, a trench 6 is formed above the via and the etch stop layer 3 above the conductive layer 2 is removed. A conformal diffusion barrier layer 7 is deposited on the sidewalls and bottom of the via 5 and trench 6 followed by performing an electroless or electroplating method, for example, to fill the via and trench with a copper layer 8. The copper damascene process is completed by a planarization step that typically involves a chemical mechanical polish (CMP) process in which the copper layer 8 becomes coplanar with the dielectric layer 4.

Figure 2:
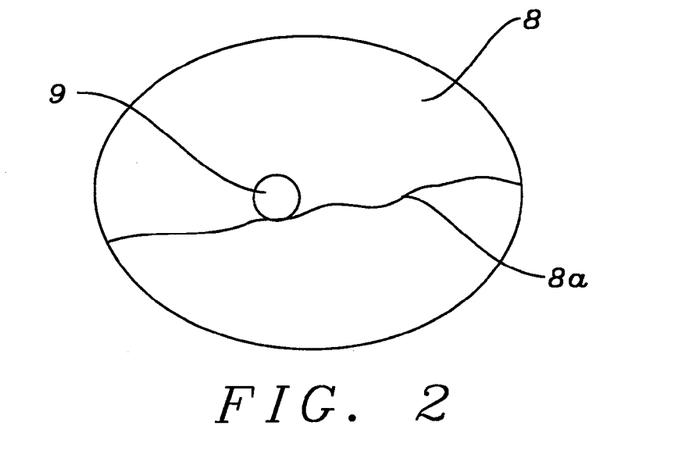
FIG. 2 is a portion of the copper layer in FIG. 1 and depicts a void defect formed along a grain boundary in the copper layer according to a prior art method.

Referring to FIG. 2, a portion of the copper layer 8 in FIG. 1 is shown which has a grain boundary 8a. A void defect 9 is shown along the grain boundary 8a. Unfortunately, in a prior art process where only one anneal is performed after the copper layer 8 is deposited, there is an unacceptably large number of void defects formed in the copper layer, especially along a grain boundary. This problem is believed to result from impurities trapped within the copper layer 8 and in particular carbon impurities that are caused by using organic additives in the copper deposition process. Since the copper layer 8 may be several thousand Angstroms thick, a single anneal at the end of the copper deposition process is not capable of removing carbon impurities in the lower portion of the copper layer.

In U.S. Pat. No. 6,077,780, a copper seed layer is deposited in an opening and is annealed above 200° C. to reflow the copper seed layer and minimize the number of seams or grain boundaries in the layer. Then an electroless or electroplating step is used to deposit a second copper layer that fills the opening. However, this method does not address the need to reduce impurities in the second copper layer.

In U.S. Pat. No. 6,245,670, a via in a dual damascene structure is filled by an electroless plating process. A barrier layer and a copper seed layer are sequentially deposited within the trench which is then filled by an electroplating process. The method is designed to enable a more effective fill of the via and trench but does not teach how to reduce C, S, or Cl impurities.

A two stage copper anneal to improve reliability of a copper damascene interconnect is disclosed in U.S. Pat. No. 6,391,777. A first anneal is performed after a copper layer is deposited in a via and trench and a second anneal at a higher temperature is carried out following a CMP process to planarize the copper layer.

In U.S. Pat. No. 6,380,084, a via is formed in a first dielectric layer and filled with a first copper layer before a trench is formed in a second dielectric layer above the via and is filled with a second copper layer. This method does not address the impurity concern and requires additional process steps which add to manufacturing cost.

A self ionized plasma (SIP) method for sputtering copper is described in U.S. Pat. No. 6,582,569. The SIP layer serves as a seed or nucleation layer in high aspect holes.

In patent application publication U.S. 2003/0140988, a catalytic layer of a noble or semi-noble metal is deposited on a seed layer to patch any discontinuities. A conductive layer such as copper is deposited on the catalytic layer and may be annealed by two step process. However, both annealing steps occur after the copper deposition which does not completely remove impurities from a thick copper layer.

Therefore, an improved method of forming copper interconnects is needed which affords good trench and via filling capability to minimize voids while providing a pathway for higher metal purity even in thick copper layers.

SUMMARY OF INVENTION

An objective of the present invention is to provide a metal interconnect with a low Rc value for improved reliability, a low defect density, and a low concentration of impurities.

A further objective of the present invention is to provide a damascene method that allows for a first anneal step after filling a via with a first metal layer and a second anneal step after filling a trench above the via with a second metal layer.

A still further objective of the present invention is to provide a method for fabricating a copper interconnect with reduced amounts of carbon, sulfur, and chloride impurities.

Yet another objective of the present invention is to provide a method for forming a thick interconnect with low impurities by employing a three metal deposition steps to fill a dual damascene structure and performing an anneal after each deposition step.

These objectives are achieved by providing a substrate on which a damascene process sequence is to be performed. In one embodiment that represents a dual damascene scheme, an etch stop layer and a dielectric layer are successively deposited on the substrate. Conventional imaging and etching techniques are followed to produce an opening comprised of a trench overlying a via in the dielectric layer in which the trench and via both have sidewalls and a bottom. The via extends through the etch stop layer and exposes a portion of the substrate which typically includes a conductive layer. A conformal diffusion barrier layer is deposited on the sidewalls and bottom of the trench and via. A thin seed layer which is preferable copper is then formed on the diffusion barrier layer. Next, a first electrochemical plating (ECP) process with a first current density is employed to deposit a first metal layer that is preferably copper with a sufficient thickness on the diffusion barrier layer to fill at least the via and a portion of the trench. A first annealing process is performed to reduce the impurity content of the first metal layer. A second ECP process is used to deposit a second metal layer which is preferably a copper layer that fills the trench. The second ECP process is comprised of a first step with a second current density that is greater than the first current density and a second step with a third current density that is higher than the second current density. A second anneal step is performed to remove impurities from the second metal layer.

In one embodiment, the first and second anneal steps are carried out by subjecting the substrate to a $H_2$ plasma in a heated process chamber. Optionally, the first and second anneal steps may involve heating the substrate in a reducing gas or inert gas environment in a furnace, for example. A CMP step is then employed to lower the level of the second metal layer to become coplanar with the dielectric layer.

In a second embodiment that is especially suited to the fabrication of a thick interconnect, the process flow of the first embodiment is followed through the step of depositing and annealing the first metal layer. A second metal layer which is preferably copper is deposited on the first metal layer with a second ECP process at a second current density and fills the trench. A second anneal process similar to the first anneal is performed to remove impurities from the second metal layer. Next, a third ECP process with a third current density is used to deposit a third metal layer that is preferably copper which overfills the trench. A third anneal process similar to the first anneal is performed to reduce impurities in the third metal layer. A CMP step is then employed to remove the third metal layer and to lower the level of the second metal layer to become coplanar with the dielectric layer.

The resulting interconnect that is formed by the first or second embodiment is comprised of the seed layer on the sidewalls and bottoms of the via and trench, a first metal layer formed on the seed layer that fills the via and a portion of the trench and has a first grain size, and a second metal layer formed on the first metal layer that fills the trench and has a second grain size. Preferably, the second grain size is about equal to the first grain size and there is no visible interface between the seed layer and first metal layer or between the first and second metal layers. When the metal is copper, the S, C, and Cl impurity content is reduced compared to prior art copper interconnects.

DETAILED DESCRIPTION OF THE INVENTION

The present invention is a method that is particularly useful in forming an interconnect with improved purity and reduced defects and is not limited to any semiconductor technology. For instance, the present invention may be applied with similar benefits during the fabrication of copper interconnects in logic devices, SRAM devices, and in other technologies known to those skilled in the art. Moreover, the method of the present invention may be repeated a plurality of times on the same substrate to form a succession of interconnects that are stacked in various designs in a plurality of layers. The drawings are provided by way of example and are not intended to limit the scope of the invention.

Figure 3:
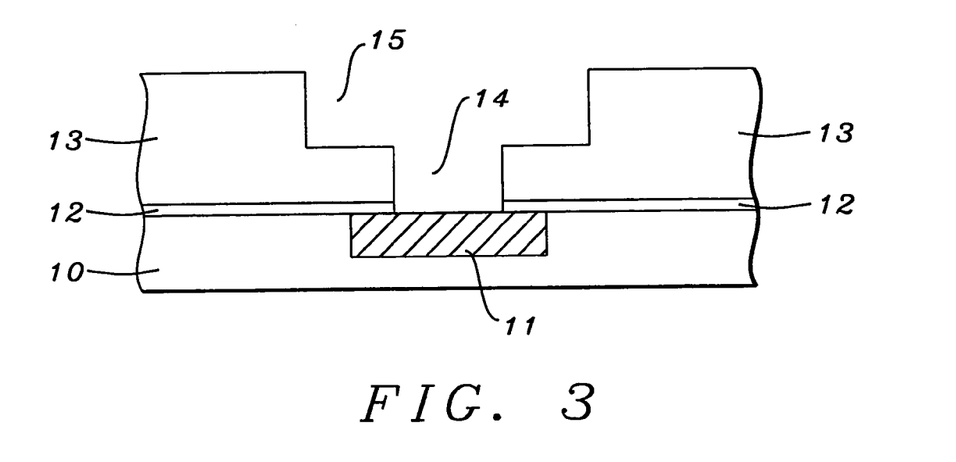
FIG. 3 is a cross-sectional view showing the formation of a via and a trench within a dielectric layer in a dual damascene scheme.

A first embodiment of the present invention is illustrated in FIGS. 3-7 with regard to the formation of an interconnect in a dual damascene scheme. However, the method may also be applied to forming an interconnect in single damascene structure such as a trench. Referring to FIG. 3, a substrate 10 is provided that is typically silicon and may include active and passive devices that are not shown in order to simplify the drawing. A conductive layer 11 is formed in substrate 10 by conventional means and is comprised of a metal such as Al, Cu, W, or an Al/Cu alloy. Optionally, the conductive layer 11 is formed on a diffusion barrier layer (not shown) within substrate 10. A diffusion barrier layer is used to protect the conductive layer from trace amounts of impurities in substrate 10 that may cause corrosion or oxidation of the conductive layer 11. A diffusion barrier layer will also prevent metal ions in the conductive layer 11 from diffusing into substrate 10 and diminishing the insulating capability of one or more adjacent dielectric layers (not shown). The surface of conductive layer 11 is typically planarized to be coplanar with substrate 10.

An etch stop layer 12 that is preferably silicon carbide, silicon oxynitride, or silicon nitride with a thickness from 300 to 500 Angstroms is deposited on substrate 10 and on the conductive layer 11 by a chemical vapor deposition (CVD) or by a plasma enhanced CVD (PECVD) technique. A dielectric layer 13 is then formed on the etch stop layer 12 by a CVD, PECVD, or a spin-on method and is comprised of $SiO_2$, phosphosilicate glass (PSG), borophosphosilicate glass (BPSG), or a low k dielectric material such as fluorine doped $SiO_2$, carbon doped $SiO_2$, a polysilsesquioxane, a poly (arylether), or a fluorinated polyimide. When the dielectric layer 13 contains a porous low k dielectric material, the dielectric layer 13 may be subjected to further processing such as heating or a plasma treatment known to those skilled in the art to densify the layer to prevent water uptake and an increase in the dielectric constant. The thickness of the dielectric layer 13 is between about 4000 and 13000 Angstroms. The etch stop layer 12 and dielectric layer 13 form a dielectric stack of layers on substrate 10 and on the conductive layer 11. Optionally, a cap layer (not shown) such as silicon oxynitride or silicon nitride is deposited on the dielectric layer 13 and forms the top layer in a dielectric stack of layers to be patterned. In an alternative embodiment, a dielectric stack of layers is formed by sequentially depositing a first etch stop layer, a first dielectric layer, a second etch stop layer (not shown), a second dielectric layer (not shown), and an optional cap layer as previously described.

A conventional sequence of steps that includes patterning a photoresist layer (not shown) and using the photoresist as an etch mask while transferring the pattern into the underlying dielectric layer is employed to produce a via 14 above the conductive layer 11. A similar sequence of steps is carried out to fabricate a trench 15 overlying the via 14. Although a via first process is generally preferred by those skilled in the art, a trench first method is also anticipated by this invention. It is understood that other dual damascene designs are possible in addition to a trench 15 that is centered over a via 14 as in FIG. 3. For example, one trench may be aligned above two or more vias. Furthermore, the trench 15 may not be centered over the via 14 but offset to one side of the via 14 while still uncovering the entire via opening. Note that after the trench 15 is formed, the via 14 is extended through the etch stop layer 12 by a plasma etch process to expose the underlying conductive layer 11. A standard cleaning process is typically performed after the etch steps that form the via 14 and trench 15 in order to remove any residue on the conductive layer 11 or on the etch stop layer 12 and dielectric layer 13.

In the alternative embodiment where the dielectric stack of layers consists of first and second etch stop layers, first and second dielectric layers and an optional cap layer, a via is formed in the second etch stop layer and extends through the first and second dielectric layers and first etch stop layer to expose a portion of a conductive layer in a substrate. Thereafter, a trench is formed in the second dielectric layer overlying the via. The distance between the top of the trench and the bottom of the via is about 4000 to 13000 Angstroms. A skilled artisan is familiar with the fabrication of this damascene structure and the alternative embodiment is not pictured in the drawings.

Figure 4:
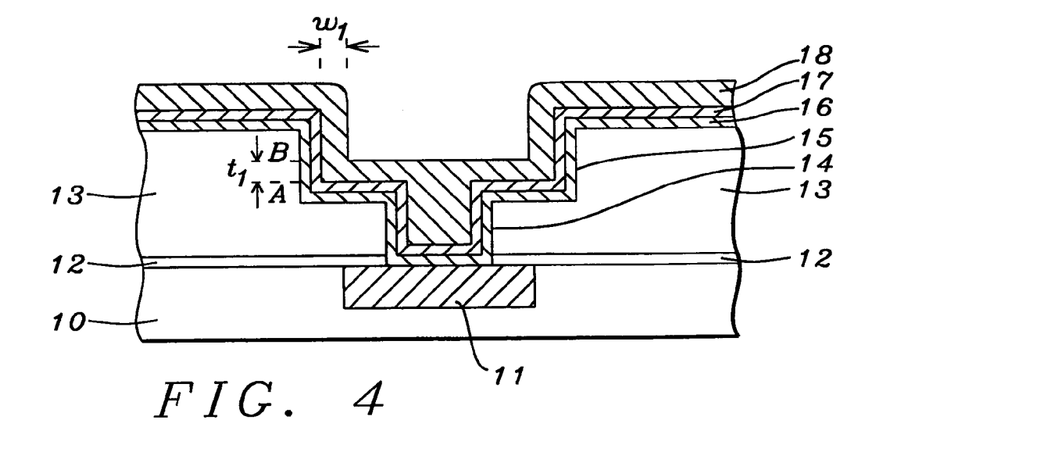
FIG. 4 is a cross-sectional view illustrating the dual damascene structure in FIG. 3 after the deposition of a diffusion barrier layer, a seed layer, and a first metal layer according to a method of the present invention.

Referring to FIG. 4, a conformal diffusion barrier layer 16 having a thickness of about 100 to 500 Angstroms is deposited on the sidewalls and bottom of the via 14 and trench 15. The diffusion barrier layer 16 is deposited by a CVD, PECVD, or an atomic layer deposition (ALD) method and is preferably comprised of one or more of Ta, TaN, Ti, TiN, TaSiN, W, and WN.

A seed layer 17 having a thickness from about 1000 to 2000 Angstroms is formed on the diffusion barrier layer 16. In the preferred embodiment, the seed layer is comprised of copper in order to provide nucleation sites for a copper layer that will be deposited in a subsequent step. The seed layer 17 is deposited by a physical vapor deposition (PVD) process or by an ionized metal plasma (IMP) sputtering method, for example. Typically, the seed layer 17 has a uniform thickness within the via 14 and trench 15 and conforms to the shape of diffusion barrier layer 16.

A first metal layer 18 that is preferably copper is then deposited by a first electrochemical plating (ECP) process on the seed layer 17. In one embodiment, a typical work piece (not shown) is comprised of a cathode to which the substrate 10 is clamped to establish an electrical contact, a copper anode, and an electrolyte solution that covers the anode and cathode. A DC current is preferably applied to the copper anode in the electrolyte solution to form $CU^{+2}$ ions that migrate to the substrate 10 at the cathode where the $CU^{+2}$ ions are reduced to deposit copper on the seed layer 17. The invention is not limited to a particular electroplating cell (work piece) or to a specific electrolyte (electroplating) solution.

When the first metal layer is copper, an exemplary first ECP process involves an electrolyte solution comprised of $CuSO_4$, HCl, $H_2SO_4$, and additives such as a suppressor, leveler, and accelerator at a temperature of 10° C. to 20° C., a pH in the range of 0.1 to 1, and with a first current density of about 5 to 15 mA/cm$^2$ and preferably 10 mA/cm$^2$. Furthermore, the current may be pulsed in which each pulse has a duration of about 30 to 60 seconds and consecutive pulses are spaced by an interval of about 3 to 6 seconds. The inventors refer to this process as ECP I10 in which the metal deposition rate is about 35 Angstroms per second. A low current density is used to form the first metal layer 18 because of a better gap filling capability, especially for small via openings. However, the film quality resulting from a low current density ECP step is not as good as from a high current density method. In particular, during a copper ECP step a larger amount of C, Cl, and S impurities are likely to be trapped in the first metal layer 18 relative to a subsequent metal layer.

The first ECP process is continued for a period of about 70 to 150 seconds until the via 14 is completely filled. The first metal layer 18 also forms on the sidewalls and bottom of trench 15 and partially fills the trench 15. For example, the distance between the dashed lines A and B indicates the thickness $t_1$ of the first metal layer 18 above the bottom of the trench 15 which is from about 2000 to 4000 Angstroms. As indicated in FIG. 4, the first metal layer 18 within the trench 15 generally conforms to the shape of the seed layer 17. However, the thickness $w_1$ of the first metal layer 18 on the sidewalls of the trench 15 is typically less than $t_1$ because of an additive effect that is otherwise known as "superfilling". In a preferred embodiment, the first metal layer 18 fills about half of the trench 15.

A first cleaning process may be performed at this point to remove any contaminants on the surface of the first metal layer 18. The first cleaning process is comprised of a treatment with dilute $H_2SO_4$ and rinsing with DI water.

In the preferred embodiment involving a copper ECP process, the electrolyte solution contains S in the form of sulfates, chloride ions from HCl or chlorine containing additives, and C from carbon containing additives. Trace amounts of S, Cl, and C are easily trapped within the first metal layer 18 and will become a source of contamination unless removed. Therefore, a first anneal step is performed by heating the substrate 10 to drive out the S, Cl, and C impurities from the first metal layer 18. In one embodiment, the substrate 10 is heated in a reducing gas or inert gas environment in a process chamber such as a furnace at about 180° C. to 260° C. for about 10 to 200 seconds. Preferably, the first anneal is performed for a period of about 30 seconds and includes $H_2$ gas. Optionally, $NH_3$ may be used as a reducing gas or one of Ar or $N_2$ is selected as an inert gas.

In an alternative embodiment, the substrate 10 is loaded into a PECVD process chamber and is treated with $H_2$ plasma. Preferred conditions for the $H_2$ plasma treatment are a $H_2$ flow rate of 5 to 10 standard cubic centimeters per minute (sccm), a RF power of about 200 to 400 Watts, a chamber pressure of 0.1 to 10 Torr, and a substrate temperature of 150° C. to 350° C. for a period of about 10 to 200 seconds and more preferably for about 30 seconds. Subjecting the first metal layer 18 to a reducing gas plasma serves to remove any metal oxides formed on the surface of the metal layer and prevents metal oxidation during the first anneal. The first anneal also improves adhesion of the seed layer 17 to the diffusion barrier layer 16. Optionally, other reducing gases such as $NH_3$ or $N_2H_4$ may be used instead of $H_2$ during the plasma treatment.

A key feature of the present invention is that the trench 15 and via 14 are not simultaneously filled in the first ECP process. The incomplete fill of the trench 15 enables impurities in the first metal layer 18 within the via 14 and near the bottom of the trench 15 to be more easily removed by an anneal step. When the first metal layer 18 is copper, a small grain size of about 0.1 micron to 0.5 micron is typically formed in the first ECP process to improve via fill capability. The first anneal step increases the copper grain size in the first metal layer 18 to about 1 micron. The larger grain size after the first anneal step improves the electrical properties of the first metal layer 18 and also improves adhesion of the seed layer 17 to the diffusion barrier layer 16. Furthermore, stress is reduced within the first metal layer 18 to prevent pullback from the seed layer 17 or pullback of the seed layer 17 and first metal layer 18 from the diffusion barrier layer 16.

Figure 5:
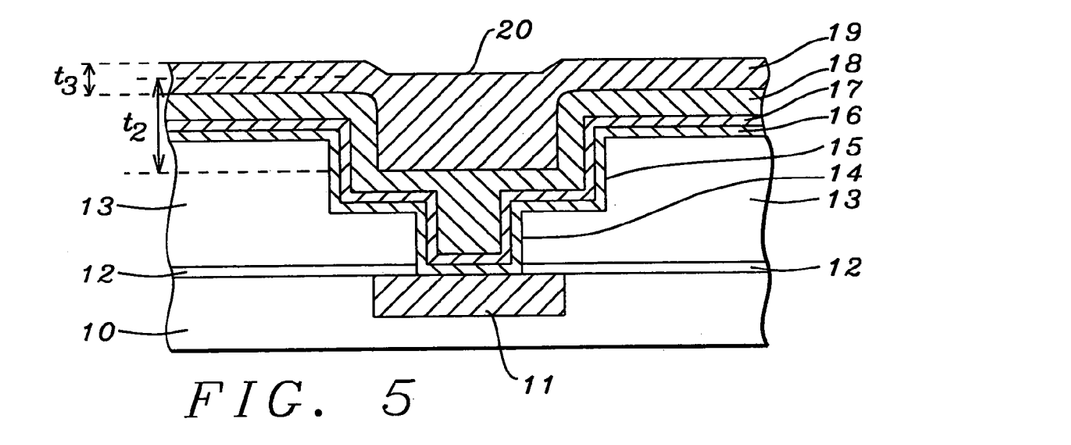
FIG. 5 is a cross-sectional view showing the dual damascene structure in FIG. 4 after deposition of a second metal layer according to the present invention.

Referring to FIG. 5, a second ECP process is performed to deposit a second metal layer 19 that is preferably copper on the first metal layer 18. In one embodiment, the second ECP process is performed in a second work piece with an electrolyte solution that does not contain HCl or a carbon based additive as described in related U.S. patent application Ser. No. 10/987,713, filed Nov. 12, 2004, herein incorporated by reference, and thereby avoids incorporating Cl and C contaminants in the second metal layer 19. Preferably, the second ECP process involves the same electrolyte solution and work piece that was employed in the first ECP process. The second ECP process is performed at a temperature of 10° C. to 20° C. and is comprised of two steps. The first step has a second current density of about 20 to 60 $mA/cm^2$ and preferably 40 $mA/cm^2$ that is applied until the second metal layer 19 fills the trench 15. This first step of the second ECP process is referred to by the inventors as ECP I40 and is continued for a period of about 30 to 50 seconds and has a metal deposition rate of about 150 Angstroms per minute.

A second step in the second ECP process immediately follows ECP I40 and is preferably carried out in the same electrolyte solution as ECP I40. The second step has a third current density that is greater than the second current density. The third current density is about 60 to 100 $mA/cm^2$ and preferably is 60 $mA/cm^2$ which is applied for a period of about 30 to 50 seconds. The second step of the second ECP process which overfills the trench 15 is referred to as ECP I60 and has a metal deposition rate of about 220 Angstroms per minute. As a result, the thickness $t_3$ of the second metal layer 19 on the first metal layer 18 above the dielectric layer 13 is about 2000 to 3000 Angstroms. The thickness $t_2$ of the second copper layer 19 between the top of the first copper layer 18 in the trench 15 to the surface 20 above the trench is about 3000 to 4000 Angstroms. The second metal layer 19 is comprised of a lower portion formed by the ECP I40 step and an upper portion formed by the ECP I60 step. The surface 20 of the second metal layer 19 may be uneven and is usually lower over the trench 15 than above the dielectric layer 13. A second cleaning process similar to the first cleaning process described earlier is preferably performed at this point.

An important feature is that a second anneal is performed after the deposition of the second metal layer 19 and second cleaning process. The second anneal is carried out in a process chamber with a reducing gas or inert gas environment at a temperature in the range of about 180° C. to 260° C. for about 10 to 200 seconds. Preferably, the second anneal is performed for about 30 seconds as $H_2$ gas is flowed into the process chamber. Optionally, NH3 may be used as a reducing gas or one of Ar or N2 may be selected as an inert gas. Although the ECP I40 and ECP I60 processes form a higher quality metal layer than the ECP I10 process, an unacceptable level of C, Cl, and S impurities is typically formed in the second metal layer 19. Thus, a second anneal is performed to remove trace amounts of impurities, form a larger grain size in the second metal layer 19, and form a smooth interface between the first metal layer 18 and the second metal layer 19. A small metal grain size of about 0.3 micron to 0.5 micron is typically formed in the second ECP process to improve trench fill capability. The second anneal step increases the grain size in second metal layer 19 to about 1 micron.

The larger grain size after the second anneal step improves the electrical properties of the second metal layer 19. The grain sire in the second metal layer 19 is not necessarily the same as the grain size formed in first metal layer 18. On the other hand, the grain size formed in the first metal layer 18 may not increase as a result of the second anneal step and preferably remains at about 1 micron which is the average diameter of a grain. The second anneal also relieves stress in the second metal layer 19 and helps to prevent pullback of the seed layer 17 from the diffusion barrier layer 16. Although the first and second metal layers 18, 19 are depicted as two distinct layers in the drawings, it is understood that the first and second metal layers 18, 19 typically form a continuous layer with no visible interface or seam in a cross-sectional view such as obtained during an analysis with a scanning electron microscope (SEM).

In an alternative embodiment, the second anneal is performed in a PECVD process chamber by heating the substrate 10 while subjecting the second metal layer 19 to a hydrogen plasma treatment that prevents oxidation of the second metal layer and reduces any metal oxides already formed on the metal surface. The PECVD process is carried out in a process chamber of a commercially available tool such as a Centura chamber from Applied Materials. Preferred process conditions are a chamber pressure of 1 to 10 mTorr, a RF power of about 300 to 400 Watts, a substrate temperature in the range of 150° C. to 400° C., and a $H_2$ flow rate of about 10 to 60 sccm for a period of 10 to 200 seconds and more preferably for 30 seconds. Those skilled in the art will appreciate that another reducing gas such as $NH_3$ or $N_2H_4$ may be used instead of $H_2$ to generate a plasma in the PECVD chamber during the second anneal step.

Figure 6:
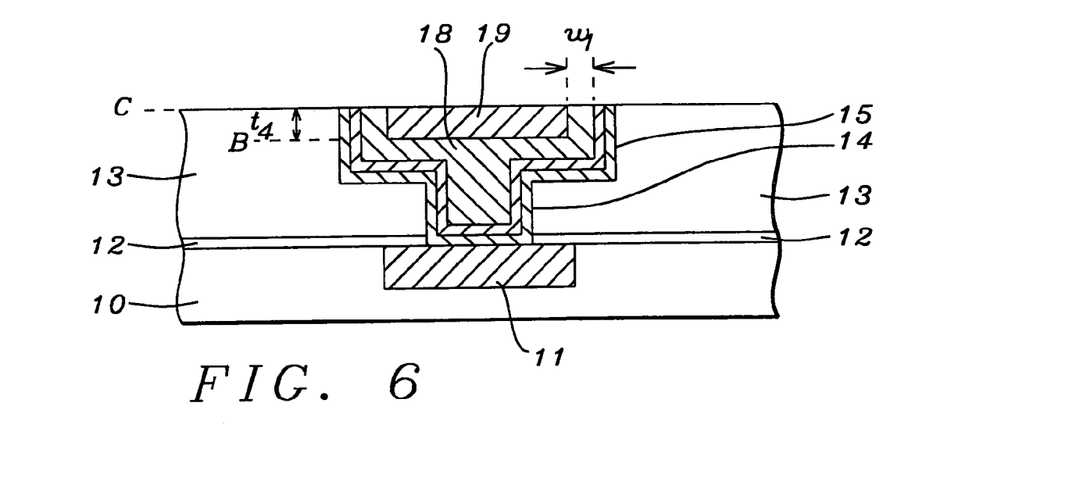
FIG. 6 is a cross-sectional view of a completed interconnect of the present invention after planarization with a chemical mechanical polish process.

Referring to FIG. 6, the dual damascene scheme is completed by a planarization method that may be a CMP process, for example. Furthermore, a CMP process may involve more than one step. For example, when the seed layer 17 and first and second metal layers 18, 19 are comprised of copper, a first Cu CMP step may be used to remove the second metal layer 19, first metal layer 18, and seed layer 17 above the dielectric layer 13 and then a second CMP step may be employed to remove the diffusion barrier layer 16 above the dielectric layer 13. A third CMP step called a buffing or oxide polish step may be used to polish the dielectric layer 13 and the exposed top surfaces of the diffusion barrier 16, seed layer 17, first metal layer 18, and second metal layer 19 within the trench 15 to form a smoother exposed top surface for each of the aforementioned layers and to remove scratches from previous CMP steps. As a result of the CMP process, the exposed top surfaces of the diffusion barrier layer 16, seed layer 17, first metal layer 18, and second metal layer 19 become coplanar with the dielectric layer 13. Note that a seed layer 17 may not be distinguishable from the first metal layer 18 and typically forms a contiguous layer with the first metal layer and second metal layer 19.

Those skilled in the art will appreciate that the copper deposition and anneal process sequence of the first embodiment may readily applied to form a single damascene structure. For example, a diffusion barrier layer and a seed layer are sequentially deposited in an opening that is preferably a trench formed in a stack of dielectric layers on a substrate. The opening has sidewalls, a top, and a bottom wherein the distance between the top and bottom is about 1500 to 4500 Angstroms. A first copper layer is deposited by the first ECP process to partially fill the opening followed by the first anneal step as previously described. Then the second ECP process as previously described for the dual damascene method is performed to deposit a second copper layer that overfills the opening. After the second anneal, a CMP process is employed to planarize the second copper layer which becomes coplanar with the top of the opening.

Figure 7A:
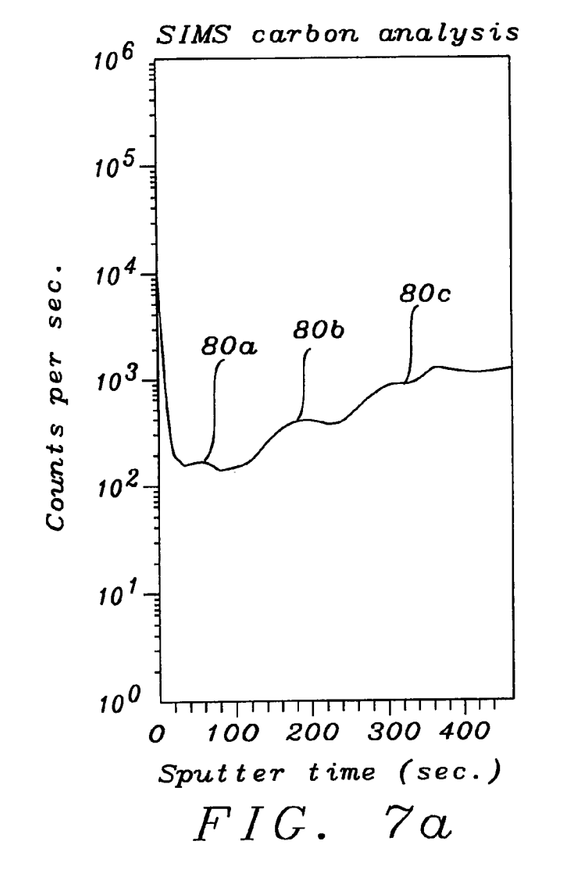
FIG. 7a is a plot showing the results of a SIMS analysis that detects the carbon content at various depths within a copper interconnect that was annealed once after a trench and via were completely filled with copper.
Figure 7B:
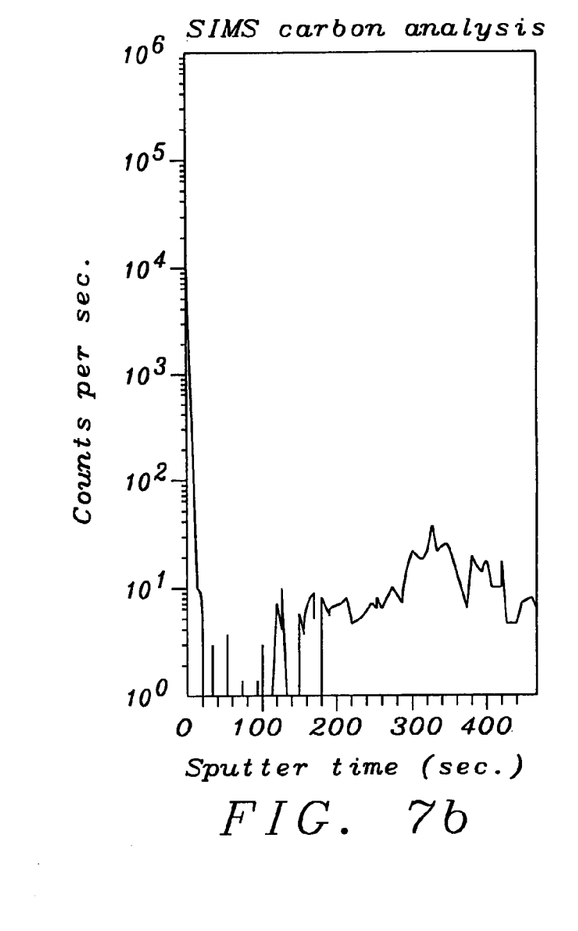
FIG. 7b is a plot showing SIMS results for carbon content at various depths in a copper interconnect that has been fabricated by a method of the present invention.

One advantage of the present invention is that an interconnect comprised of a seed layer 17, first metal layer 18, and second metal layer 19 has a lower impurity content than a metal interconnect fabricated by an alternative ECP process. Referring to FIG. 7a, a plot shows the results of a SIMS analysis that detects the carbon impurity content at various depths within a copper interconnect filled by just one copper layer and which was formed by an alternative process known to the inventors. The alternative process involves the sequence: ECP I10; ECP I40; ECP I60; a cleaning step; and then an anneal step similar to the first anneal process described previously. FIG. 7b is a plot showing the results of the same SIMS analysis performed on the copper interconnect represented by the structure in FIG. 6 which was formed by the present invention and indicates a lower carbon impurity content. The sequence of the first embodiment of the present invention is the following: ECP I10; a first cleaning step; first anneal; ECP I40; ECP I60; a second cleaning step; second anneal; and CMP.

It is understood that an increasing sputter time along the x-axis reflects a deeper depth in the copper interconnect. Therefore, the left portion 80a of the plot in FIG. 7a shows the carbon content in the copper layer formed during the ECP I60 process, the middle portion 80b of the plot indicates the carbon content in the portion of the copper layer formed in the ECP I40 process, and the right portion 80c shows the carbon content of the copper layer formed during the ECP I10 process. Note that the exact boundaries between the portions of the copper layer formed by the ECP I10, ECP I40, and ECP I60 processes are difficult to determine. A comparison of the two plots in FIGS. 7a and 7b indicates that the copper interconnect formed by an alternative process has more carbon impurities at all depths (sputter times) than the interconnect formed by the method of the present invention. A similar decrease in S and Cl impurities is observed in a SIMS analysis of a copper interconnect formed by the first embodiment.

As a result, the higher purity of the metal interconnect comprised of the seed layer 17, first metal layer 18, and second metal layer 19 of the present invention will have a lower resensitivity than the metal interconnect formed by the alternative process. This improvement leads to lower Rc delay and higher device performance. An improvement in Rc delay and reliability is also achieved by the first and second anneal processes which improve adhesion of the seed layer 17 to the diffusion barrier layer 16 and thereby prevent pullback of the seed layer and overlying first metal layer 18 and second metal layer 19 from the diffusion barrier layer. Additionally, the void defect count as monitored by a KLA inspection known to those skilled in the art shows a reduction from 1000 defects per wafer to <5 defects per wafer when comparing the alternative process described above to the method of the first embodiment. The size of the measured defects is about 0.1 to 0.5 microns in diameter. The reduced number of void defects is attributed to a lower carbon impurity content as depicted in FIG. 7b.

Those skilled in the art will appreciate that prior art methods which involve a single copper deposition to fill a trench and via followed by a single anneal will also have a higher carbon impurity content in the resulting copper interconnect than the copper interconnect formed by the present invention.

In a second embodiment, the process outlined in the first embodiment is modified to accommodate thicker interconnects. In other words, when a thicker first and/or second metal layer is required, the second anneal following an ECP I40 and ECP I60 process sequence may not be sufficient to lower the carbon impurity content in the interconnect to an acceptable level. Instead, an additional anneal step is inserted between the ECP I40 and ECP I60 processes.

Figure 8:
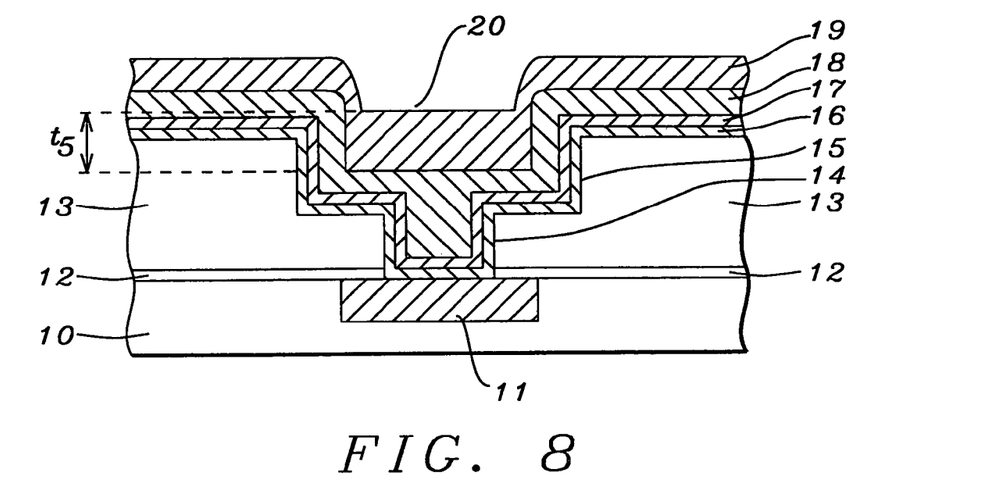
FIG. 8 is a cross-sectional view showing the dual damascene structure in FIG. 4 after deposition of a second metal layer according to a second embodiment of the present invention.

The first embodiment is followed to the point where the first metal layer 18 is deposited by the ECP I10 process, a first cleaning process is completed, and a first anneal is performed as depicted in FIG. 4. Referring to FIG. 8, a second metal layer 19 that is preferably copper is deposited on the first metal layer 18 by performing an ECP I40 process as described previously. In this embodiment, the duration of the ECP I40 process is long enough to form a second metal layer 19 that completely fills the trench 15. The surface 20 of the second metal layer 19 is uneven and is at a lower level above the trench 15 than above the dielectric layer 13. The thickness $t_5$ of the second metal layer 19 between the top of the first metal layer 18 above the via 14 and the surface 20 above the trench 15 is about 3000 to 5000 Angstroms. Preferably, the surface 20 of the second metal layer 19 is coplanar with or slightly higher than the top of the dielectric layer 13. A second cleaning step may be employed here.

An important feature is that a second anneal is performed after the deposition of the second metal layer 19. The second anneal is carried out in a process chamber with a reducing gas or inert gas environment at a temperature in the range of about 180° C. to 260° C. for about 10 to 200 seconds and preferably for about 30 seconds. Although the ECP I40 process forms a higher quality metal layer than the ECP I10 process, an unacceptable level of C, Cl, and S impurities is typically formed in the second metal layer 19. Thus, a second anneal is performed to remove trace amounts of impurities, form a larger grain size in the second metal layer 19, and to form a smooth interface between the first metal layer 18 and the second metal layer 19. The second anneal step increases the metal grain size in second metal layer 19 which improves the electrical properties of the second metal layer 19. Although the grain size in the second metal layer 19 is not necessarily the same as the grain size formed in first metal layer 18, preferably the grain size is about 1 micron in both the first and second metal layers. The second anneal also relieves stress in the second metal layer 19 and serves to prevent pullback of the seed layer 17 from the diffusion barrier layer 16.

Figure 9:
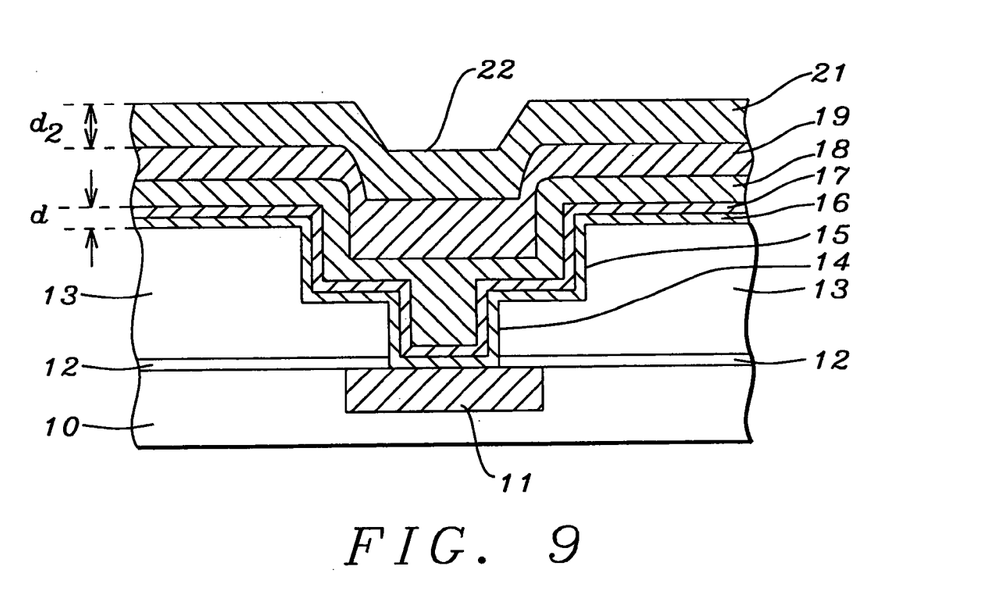
FIG. 9 is a cross-sectional view of the damascene structure in FIG. 8 after deposition of a third metal layer according to the second embodiment of the present invention.

Referring to FIG. 9, the distance d between the top of the dielectric layer 13 and the surface 20 of the second metal layer 19 above the trench 15 may increase as a result of the second anneal. There may be a reflow of the second metal layer 19 that causes low portions on the surface 20 to become slightly elevated while some of the higher portions on the surface are lowered. The surface of the second metal layer is still uneven after the second anneal. Next, a third metal layer 21 is preferably deposited as an overfill of the trench 15 so that a subsequent planarization process does not cause a divot or dishing defect in the second metal layer 19 within the trench. Although the second metal layer 19 could be formed at a larger thickness to avoid the need for a third metal deposition, the second anneal of a thick second metal layer would not be as effective in removing impurities as from a thinner second metal layer 19 according to the second embodiment.

Therefore, a third ECP process is performed to deposit a third metal layer 21 that is preferably comprised of copper on the second metal layer 19. In a preferred embodiment, the third ECP process involves the same electrolyte solution and work piece that was employed in the second ECP process. Optionally, a second electrolyte solution in a second work piece is employed for the third ECP process. The third ECP process (ECP I60) is performed using the previously described conditions. As a result, the third metal layer 21 has a thickness $d_2$ about 1000 to 2000 Angstroms above the second metal layer 19 on portions of the second metal layer that are above the dielectric layer 13. Note that the surface 22 of the third metal layer 21 may be uneven and have a lower level above the trench 15 than above the dielectric layer 13. A third cleaning step may be performed at this point.

Another key feature of the second embodiment is that a third anneal process is performed after the third metal layer 21 is deposited and is comprised of the same process conditions as used for the first or second anneal processes. In one embodiment, the third anneal is carried out in a reducing gas or inert gas environment in a furnace at a temperature in the range of about 180° C. to 260° C. for about 10 to 200 seconds. Preferably, $H_2$ is used to provide a reducing gas environment for a period of about 30 seconds. Optionally, $NH_3$ may be used as a reducing gas or an inert gas such as $N_2$ or Ar may be flowed into the furnace during the third anneal process.

Alternatively, the third anneal is performed in a PECVD process chamber by heating the substrate 10 while subjecting the third metal layer 21 to a hydrogen plasma treatment for about 30 seconds as described in the first embodiment. The $H_2$ plasma treatment prevents oxidation of the third metal layer 21 and reduces any metal oxides already formed on the metal surface. Optionally, another reducing gas such as. $NH_3$ or $N2H_4$ may be used instead of $H_2$ to generate a plasma in the PECVD chamber during the third anneal step. The third anneal is primarily used to remove C, Cl, and S impurities from the third metal layer 21.

The dual damascene scheme is then completed with a CMP process to planarize the second metal layer 19 which becomes coplanar with the dielectric layer 13. In one embodiment, the entire third metal layer 21 is removed along with portions of the second metal layer 19, first metal layer 18, seed layer 17, and the diffusion barrier layer 16 above the dielectric layer 13. As indicated previously, when the seed layer 17 and metal layers 18, 19, 21 are comprised of copper, the CMP process may include a first Cu CMP step that polishes the metal layers 18, 19, 21 and seed layer 17, a second step that polishes the diffusion barrier layer 16, and a third oxide polishing step that smoothes the surface of the dielectric layer 13.

The benefits provided by the second embodiment are the same as described in the first embodiment with the added advantage that a thicker metal interconnect may be formed while maintaining a low carbon impurity content.

The present invention is also an interconnect with a low impurity content and low defect count. The interconnect may be comprised of TaN and copper. The opening is formed in a dielectric layer or in a stack of dielectric layers on a substrate. In a preferred embodiment, the interconnect is comprised of a copper seed layer that is formed on the sidewalls and bottom of the opening, a first copper layer formed on the copper seed layer, and a second copper layer formed on the first copper layer. When the opening is a via and an overlying trench in a dual damascene structure, the copper seed layer forms a conformal coating about 1000 to 2000 Angstroms thick on the sidewalls and bottoms of the via and trench. The first copper layer has a first grain size, completely fills the via, and has a first thickness on the sidewalls of the trench and a second thickness greater than the first thickness on the bottom of the trench. The second copper layer has a second grain size and fills the remainder of the trench. Preferably, the first grain size and second grain size are about 1 micron. The top portions of the seed layer, first copper layer, and second copper layer are coplanar with the top of the opening. The distance from the top to the bottom of the opening is about 4000 to 13000 Angstroms. The interconnect is formed by a process as described in the first or second embodiment that results in a low C, S, and Cl impurity content. In one example, the C content at all depths within the copper interconnect of the present invention is <100 counts/sec., the S content is <20 counts/sec., and the Cl content is <10 counts per second as determined by a SIMS analysis. The low impurity content affords a low resistivity of less than about 2.2 ohms-cm and thus a lower Rc value for the interconnect compared to prior art. Furthermore, fewer defects such as voids are formed within the interconnect. In a typical KLA measurement, less than 5 void defects per wafer are observed. It is believed that voids form at carbon impurity locations along grain boundaries. Since the carbon content in the interconnect of the present invention (FIG. 7b) is reduced compared to a prior art interconnect (FIG. 7a), there are less carbon impurity sites where defects can form.

While this invention has been particularly shown and described with reference to, the preferred embodiments thereof, it will be understood by those skilled in the art that various changes in form and details may be made without departing from the spirit and scope of this invention.

We claim:

1. A metal interconnect structure having a low concentration of impurities, comprising:
   (a) a seed layer formed on the sidewalls and bottom of an opening, said opening comprising a via and an overlying trench formed in a stack of dielectric layers on a substrate;
   (b) a first metal layer over said seed layer, said first metal layer filling said via and partially filling said trench, said first metal layer having (i) a first grain size, (ii) a first thickness on the sidewalls of the trench, and (iii) a second thickness on the bottom of the trench; and
   (c) a second metal layer over said first metal layer, said second metal layer filling said trench, said second metal layer having (i) a second grain size, and (ii) being coplanar with the top of said opening;
   wherein at least one of said first and second metal layers and said seed layer comprise impurities, said impurities being (i) carbon in a concentration of less than about 100 counts per second, (ii) sulfur in a concentration of less than about 20 counts/sec. and (iii) chloride in a concentration of less than about 10 counts/sec.

2. The metal interconnect structure of claim 1, wherein the first and second metal layers are copper.

3. The metal interconnect structure of claim 2, wherein the seed layer is copper and has a thickness of about 1000 Angstroms (Å) to about 2000 Å.

4. The metal interconnect structure of claim 1, wherein the distance from the top to the bottom of said opening is about 4000 Å to about 13000 Å.

5. The metal interconnect structure of claim 1, further comprising a diffusion barrier layer disposed between the seed layer and the opening.

6. The metal interconnect structure of claim 1, wherein the first grain size and the second grain size are about 1 micron.

7. The metal interconnect structure of claim 1, wherein the seed layer, first metal layer, and second metal layer form a contiguous layer with no seam.

8. The metal interconnect structure of claim 1, wherein the metal interconnect has void defects of about 0.1 to 0.5 microns in size that number less than about 5 per substrate.

9. The metal interconnect structure of claim 1, wherein the metal interconnect has a resistivity of less than about 2.2 ohms-cm.

10. A metal interconnect structure having a low concentration of impurities, comprising:
    (a) an opening comprising a via and an overlying trench formed in a stack of dielectric layers on a substrate, said opening have sidewalls and an opening;
    (b) a diffusion barrier layer formed on the sidewalls and the bottom of said opening;
    (c) a seed layer formed on the diffusion barrier layer;
    (d) first metal layer over said seed layer, said first metal layer filling said via and partially filling said trench, said first metal layer having (i) a first grain size, (ii) a first thickness on the sidewalls of the trench, and (iii) a second thickness on the bottom of the trench; and
    (e) a second metal layer over said first metal layer, said second metal layer filling said trench, said second metal layer having (i) a second grain size, and (ii) being coplanar with the top of said opening;
    wherein the first and second metal layers comprise a low level of impurities resulting in a resistivity of said interconnect of about 2.2 ohms-cm or loss.

11. The metal interconnect structure of claim 10, wherein said impurities comprise carbon in a concentration of less than about 100 counts per second as determined by a secondary ion mass spectroscopy (SIMS) analysis.

12. The metal interconnect structure of claim 10, wherein said impurities comprise sulfur in a concentration of less than about 20 counts per second as determined by a SIMS analysis.

13. The metal interconnect structure of claim 10, wherein said impurities comprise chloride in a concentration of less than about 10 counts per second, as determined by a SIMS analysis.

14. The metal interconnect structure of claim 10, wherein the first and second grain sizes are equal.

15. The metal interconnect structure of claim 14, wherein the first and second grain sizes are about 1 micron.

16. The metal interconnect structure of claim 10, wherein the first thickness on the sidewalls of the trench is smaller than the second thickness on the bottom of the trench.

17. A metal interconnect structure having a low concentration of impurities, comprising:
    (a) a seed layer formed on the sidewalls and bottom of an opening, said opening comprising a via and an overlying trench formed in a stack of dielectric layers on a substrate;
    (b) a first metal layer over said seed layer, said first metal layer filling said via and partially filling said trench, said first metal layer having: (i) a first grain size, (ii) a first thickness an the sidewalls of the trench, and (iii) a second thickness on the bottom of the trench; and
    (c) a second metal layer over said first metal layer, said second metal layer filling said trench and having a second grain size;
    wherein said first and second metal layers comprise copper; and
    wherein at least one of said first and second metal layers and said seed layer comprise impurities, said impurities comprising carbon in a concentration of less than about 100 counts per second as determined by a secondary ion mass spectroscopy (SIMS) analysis.

18. The metal interconnect structure of claim 17, wherein said impurities further comprise sulfur in a concentration of less than about 20 counts per second and chloride in a concentration of less than about 10 counts per second, as determined by a SIMS analysis.

19. The metal interconnect structure of claim 17, wherein the resistivity of said interconnect is about 2.2 ohms-cm or less.

20. The metal interconnect structure of claim 10, wherein the first and second grain sizes are about 1 micron.

* * * * *

UNITED STATES PATENT AND TRADEMARK OFFICE
CERTIFICATE OF CORRECTION

| | | |
|---|---|---|
| PATENT NO. | : 7,432,192 B2 | Page 1 of 1 |
| APPLICATION NO. | : 11/347946 | |
| DATED | : October 7, 2008 | |
| INVENTOR(S) | : Hsien-Ping Feng et al. | |

It is certified that error appears in the above-identified patent and that said Letters Patent is hereby corrected as shown below:

Column 1, line 8, delete "tided" and insert therefor --titled--.

Column 13, line 54, in Claim 10, after (d) insert --a--.

Column 14, line 36, in Claim 17, delete "an" and insert therefor --on--.

Signed and Sealed this

Seventeenth Day of February, 2009

JOHN DOLL
*Acting Director of the United States Patent and Trademark Office*